United States Patent [19]
Horst

[11] Patent Number: 5,715,181
[45] Date of Patent: Feb. 3, 1998

[54] ISOGRAMMETRIC ANALYSIS METHOD FOR HIGH-YIELD PROCESSES

[76] Inventor: Robert L. Horst, 1568 Linden Ave., Lancaster, Pa. 17601

[21] Appl. No.: 415,651

[22] Filed: Apr. 3, 1995

[51] Int. Cl.⁶ .................................................. G06F 19/00
[52] U.S. Cl. .................. 364/554; 364/552; 364/551.01; 364/468.16; 364/468.17
[58] Field of Search ............................. 364/552, 554, 364/152, 551.01, 474.16, 269.4, 264.7, 468, 402, 468.15, 468.16, 468.17; 395/118, 140

[56] References Cited

U.S. PATENT DOCUMENTS

| | | | |
|---|---|---|---|
| 5,134,574 | 7/1992 | Beaverstock et al. | 364/551.01 |
| 5,245,554 | 9/1993 | Tsuyama et al. | 364/552 |
| 5,257,206 | 10/1993 | Hanson | 364/502 |
| 5,311,759 | 5/1994 | Mangrulkar et al. | 72/12 |
| 5,339,257 | 8/1994 | Layden et al. | 364/552 |
| 5,440,478 | 8/1995 | Fisher et al. | 364/188 |

*Primary Examiner*—Emanuel T. Voeltz
*Assistant Examiner*—Tony M. Cole

[57] ABSTRACT

A method is provided for process monitoring by statistical measurement of level-of-defectives performance in manufacturing and other processes. Statistical performance data functions of mean-value shift and deviation ratio are plotted on an isogrammetric chart for off-line analysis or, alternatively, are entered into a computer that has been programmed with the isogrammetric format. The resultant information revels the probable process yield and is useful to certify quality of performance in direct terms of level of defectives being produced. The method is particularly useful for high-yield processes where statistical sampling and inspection methods tend to miss the relatively few defectives and statistical process control (SPC) criteria appear to indicate that a manufacturing process is "in control".

10 Claims, 5 Drawing Sheets

ISOGRAMMETRIC ANALYSIS METHOD FOR HIGH-YIELD PROCESSES

FIELD OF THE INVENTION

The invention relates to process monitoring and, more particularly, to quality-of-performance measurement for manufacturing processes.

BACKGROUND ART

Current practice in process performance analysis is largely based upon foundation work by W. A. Shewhart (see "The Economic Control of Quality of a Manufactured Product"—1931), W. E. Deming (see "Out of the Crisis"—1986), and Genichi Taguchi (see "On-Line Quality Control During Production"—1981). All teach the use of process statistical techniques involving mean value and standard deviation. Mean value is the arithmetic mean or average of all measured data. Standard deviation is a statistical metric (criterion of measurement) for data dispersion or scatter and is estimated from formulae or tables using range (R)—the difference between the high and low values—of the data, or is calculated by the RMS (root-mean-squared) method. Both mean and standard deviation are single-key functions on many hand-held electronic calculators (such as the Hewlett Packard model 15) and act upon entered data.

In business and industry applications, process statistical data are collected by manual and, sometimes, automatic methods to provide a base of performance data. The data are analyzed by well-known statistical methods to determine mean value (X-bar or $\overline{X}$) and standard deviation (sigma or $\sigma$) for a process variable. Analysis is done by off-line manual procedure and/or on-line automatic numeric and graphic methods that are variously called SPC (statistical process control), SQC (statistical quality control), TQC (total quality control), and the like. These methods provide qualitative performance metrics for manufacturing processes, usually classifying a process' performance as either in-control or out-of-control, with process variation being interpreted as due to special (assignable) and/or common causes. Special causes are signaled by systematic data variation and common causes by randomness in the data. Upper and lower control limits (UCL and LCL) are defined for the data. Statistical tables are employed to look up and, with cumbersome interpolation and interpretation, estimate the probable level of nonconforming data (or defectives or defaults or failures) that exist among the majority conforming data (or perfects). Sometimes indices of process capability and/or effectiveness are calculated using a ratio of the allowable tolerance limits and the natural variation based on standard deviation.

A variation of customary practice is the Six-Sigma method pioneered by Motorola Inc. who won the 1988 Malcolm Baldrige National Quality Award by using it. The six-sigma quality-of-performance method employs a statistical criterion wherein the process yield target is a maximum of 3.4 parts per million defect-rate as described by P. H. Francis (see "Statistics of High-Yield Manufacturing Processes"—1988). The six-sigma method and SPC/SQC/TQC implementations are means for monitoring manufacturing and other processes to allow statistical characterization of process data to obtain quality-of-performance values for comparison to desired production quality targets and predetermined operating limits for the ultimate purpose of defect prevention by subsequent manual or automatic process adjustment.

For example, U.S. Pat. No. 5,311,759, issued to Mangrulkar et al, discloses a method and system for statistical monitoring in real-time the operation of a stamping press for forming automobile parts and the like. The method includes defining a plurality of process features, collecting production operating data, extracting feature values from the production data, and comparing the production feature values to predetermined operating limits within which acceptable parts are formed.

U.S. Pat. No. 5,339,257, issued to Layden et al, discloses a method and system for monitoring a multiparameter manufacturing process by examining in real-time a stream of data units each including a numerical characteristic indicative of a current state of one of the process parameters. The system employs a data base to group and evaluate all data units using statistical evaluation criteria, and to identify and generate signals so that an indication of the significance of the statistical pattern and the process parameter involved are given in such terms as to permit human evaluation of and, if necessary, manual or automatic intervention in the manufacturing process.

U.S. Pat. No. 5,134,574, issued to Beaverstock et al, discloses a process control apparatus and method which provide real-time indications of performance of plant operations and enables operations personnel to make timely adjustments to process means to improve current performance of the plant operations. Sensors provide direct data input to computer means which perform programmed computations on the input data to provide quantitative information of current performance of plant operations. The control apparatus provides the computer information in graphical form displayed on video displays and stores the computed information in a data base which enables access for other applications.

These existing systems and methods for monitoring manufacturing processes use process data collection, statistical measures and display means to compare process performance to predetermined performance criteria and operating limits, for purpose of evaluating and then correcting the process by manual or automatic adjustment of certain process parameters to minimize and prevent the occurrence of defective process control action and/or defective product. There is no analytic means for quantifying the level of defectives relating to process parameter variation in terms of percentage or number of out-of-tolerance occurrences over time. Neither is there analytic means for quantifying the level of defectives that can be statistically predicted for a product being produced by a given manufacturing process.

Current practice using existing systems and methods with statistical defect sampling on high-yield processes tend to miss the relatively few defectives that occur and may erroneously predict zero-defects performance. A high-yield process is any process with capability (total tolerance divided by six sigma) greater than unity and yielding more than 99.7 percent perfects, that is, fewer than three defective actions or parts per thousand opportunities.

Because high-yield processes in particular are relatively insensitive to statistical defect monitoring and to comparison against SPC limits and statistical control criteria due to the relatively few defectives and the tendency for them to be missed because all samples can be within allowable tolerance range, it is most desirable to implement an analysis method that provides quantitative statistical level-of-defectives information for both off-line (manual) control use or on-line real-time control by an operator working in collaboration with a computer-assisted system or automatic computer-based system.

SUMMARY OF THE INVENTION

It is an object of the present invention to provide an improved method and system for monitoring a high-yield manufacturing process.

It is also an object to provide a method for process quality-of-performance analysis utilizing an isogrammetric chart or equivalent computer implementation thereof which directly calculates and displays a statistical prediction of level of defectives and process yield for a manufacturing process or other operation where performance can be described using numeric data.

In carrying out the above and other objects of the present invention, a quality-of-performance analysis and measurement method is provided for use in manufacturing plants and wherever processes exist and performance data can be accumulated, to ascertain from process statistics a direct evaluation of level of defectives and, complementarily, process yield. A defective in any process and venue is an error, faulty part or action, or out-of-tolerance variable. The method comprises the steps of:

acquiring process data and calculating the statistical process control metrics mean-value and standard deviation, these metrics representing process parameters and variables that exhibit variation from targeted specification values, comparing these statistical metrics to respective process target values by calculating the shift from the target mean (hereinafter called mean-value shift) and calculating the ratio of the design-specification tolerance to standard deviation (hereinafter called deviation ratio) for each process parameter or variable, plotting instantaneous or time-averaged values of mean-value shift and deviation ratio on an isogrammetric chart consisting of a spatial array of lines along which there is a constant value (hereinafter called isograms) of defect-level performance, and providing level-of-defectives performance measurement directly from the isogram that by contiguity corresponds to the chart coordinates established by the plotted statistical functions of mean-value shift and deviation ratio.

A system is also provided for carrying out the method.

The advantages of the present invention are pertinent to the competitiveness and economics of a manufacturing process or operation where high-yield performance is essential due to either the economic value of the materials used or the realized economic loss to customers when a defective item or product feature is inadvertently served to a customer. Sometimes a defective product or service is unsafe and a customer is at risk. Customer losses due to nonperformance or improper performance of a good or service ultimately become a loss to a manufacturer or service provider in terms of cost of repair, replacement, or litigation, and in lost repeat business opportunities. The immediate advantage is the certification of process yield performance or, alternatively, the notification and warning of anomalous manufacturing performance in direct terms of level of defectives being produced when statistical process control data can appear to indicate that a manufacturing process is "in control". These advantages and other advantages of the present invention will become apparent to those skilled in quality management statistical methods and continuous quality improvement methods from the following description. The detailed description particularly refers to the accompanying drawings.

DESCRIPTION OF PREFERRED EMBODIMENT

The invention is primarily directed toward a graphical method for evaluating and measuring a manufacturing process' performance in terms of its defectives that likely are occurring or will be experienced if process adjustments and/or improvements are not implemented.

Figure 1A:
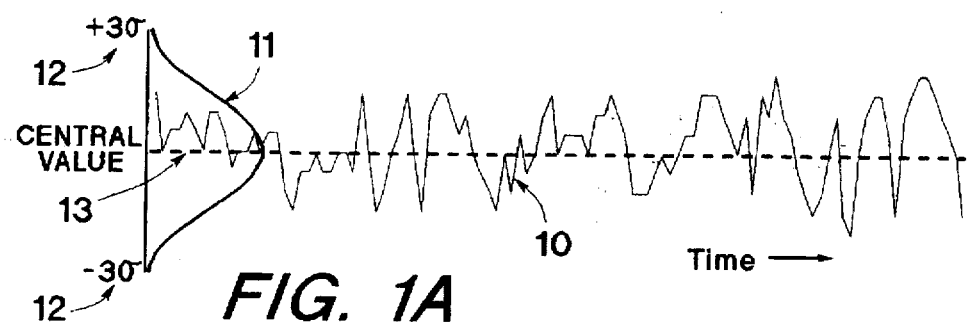
FIG. 1A is a graphical representation of raw data from a manufacturing or other process showing variation with time and the statistical deviation thereof.

In FIG. 1A there is shown typical variation over time of raw data 10 for a process variable such as line speed, web tension, oven temperature, and the like, or for an in-process product variable such as dimension, color, hardness, and the like. The statistical distribution over time is typically a normal or Gaussian distribution illustrated by bell-shaped curve 11. $\pm 3\sigma$ limits 12 define the cumulative distribution of 99.7 percent of random data around a central value or mean 13.

Figure 1B:
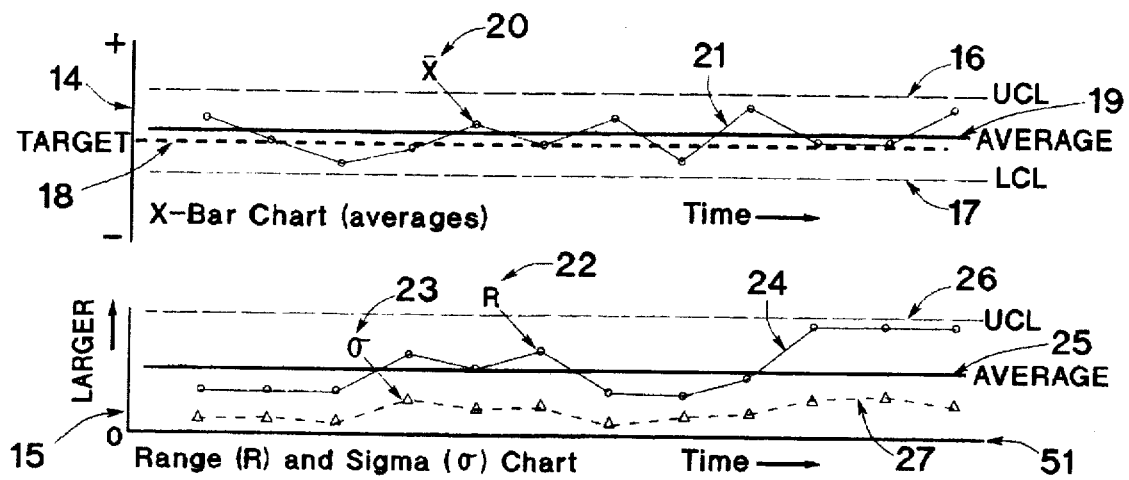
FIG. 1B is a representation of SPC process performance graphs showing both X-bar ($\bar{X}$) and range (R) or sigma ($\sigma$) charts.

Referring now to FIG. 1B, there are shown two statistical process control (SPC) graphs 14 and 15 customarily called X-bar and R (or sigma) charts, respectively. Target value 18 is the specification value for the average 19 or mean of the data. Plotted X-bar values 20 are for subgroups of raw data 10 consisting typically of ten or more consecutive pieces of data, and the connecting-line 21 is a graph of the continually changing mean value of the process or product variable. Upper control limit 16 and lower control limit 17 define a pass-fail zone of process performance for subgroup X-bar values. Data variation range R values 22 and standard deviation sigma ($\sigma$) values 23 represent the scatter of raw data 10 within the subgroups. Connecting-line 24 is a graph of the continually changing range of variation in data subgroups with average range 25. The pass-fail zone for subgroup data range is between zero limit 51 and upper control limit 26. The correlating line-graph 27 shows the corresponding subgroup data variation in terms of sigma 23.

Figure 1C:
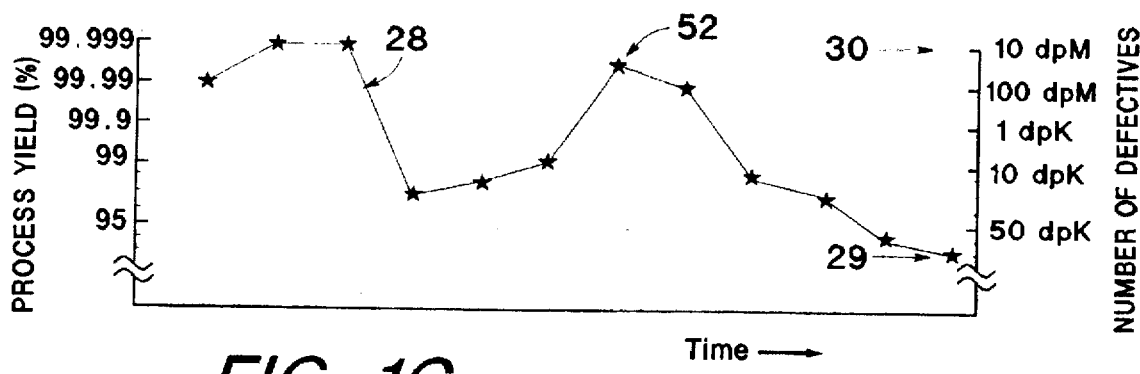
FIG. 1C is a graph of process yield as derived using the present invention by merging SPC data from FIG. 1B and plotting it according to FIG. 2.

Referring now to FIG. 1C, there is shown a line graph 28 of process yield as derived using the present invention and of the subgroup SPC X-bar values 20 and sigma values 23 of FIG. 1B to determine plotted values 52. Point-to-point yield performance 28 is derived from level-of-defectives determinations made using the isogrammetric graphical method later illustrated in FIG. 2. Note that all of the plotted SPC data of FIG. 1B are within the specified control limits 16 and 17 for X-bar and upper limit 26 and zero limit 51 for sigma, indicating "in control" performance. Note further that FIG. 1C reveals a level-of-defectives performance ranging from greater than 50 defects per thousand (dpK) 29 to the order of 10 defects per million (dpM) opportunities 30. Observe that the plotted values 52 are the level-of-defectives values as may be determined using FIG. 2, and the corresponding process-yield values are simply calculated as the percentage of defectives in the total number of opportunities.

Figure 2:
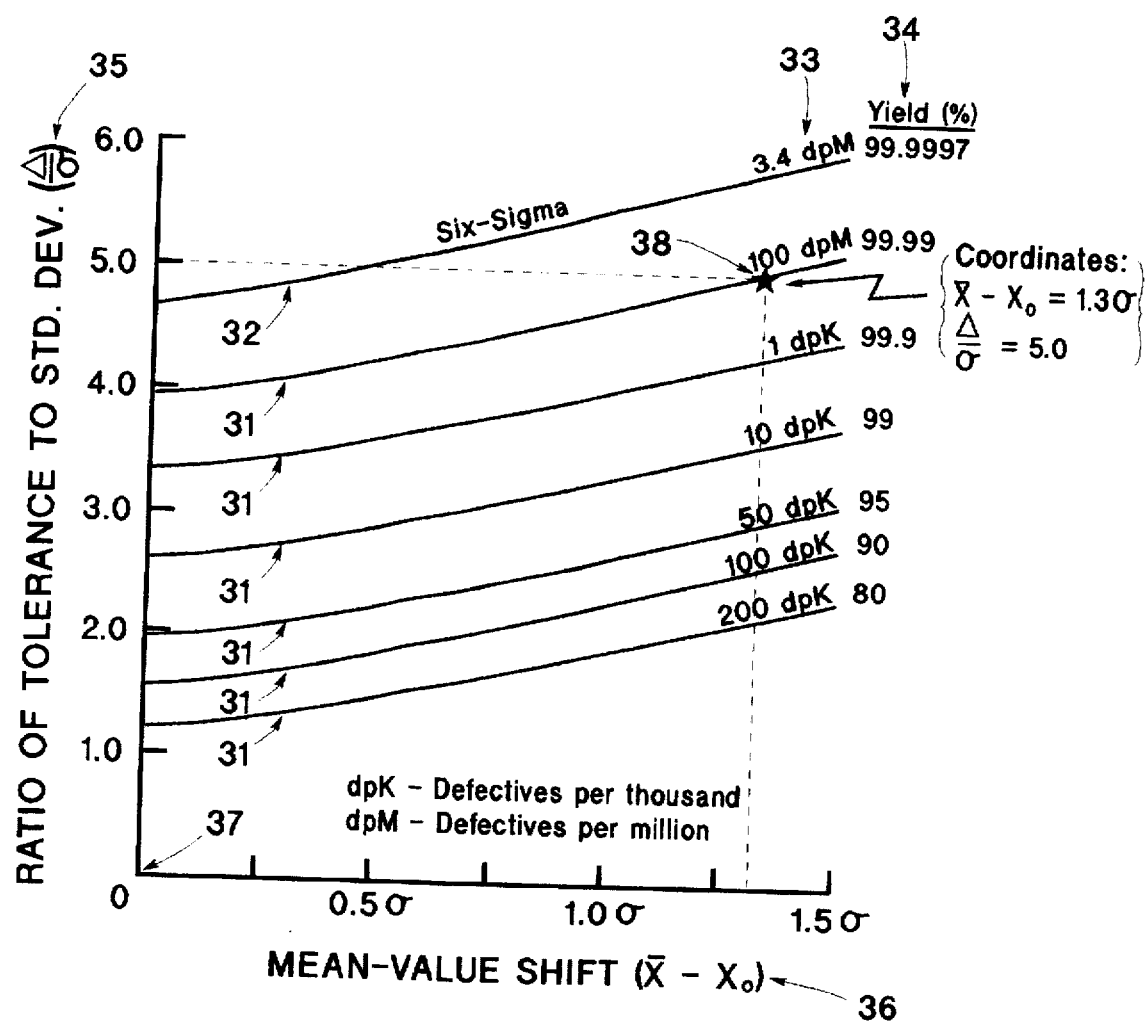
FIG. 2 is a two-dimensional spatial representation showing a family of isograms for quantifying process performance by graphical means.

FIG. 2 shows the isogrammetric graphical means wherein process statistical metrics of standard deviation $\sigma$ as a divisor of design tolerance $\Delta$ (deviation ratio 35 $\Delta/\sigma$), and mean-value $\overline{X}$ shift from specification $X_0$ (mean-value shift 36 $\overline{X}-X_0$), are plotted against a spatial representation of level-of-defectives isograms 31 and 32, that is, lines of constant process performance in terms of number of defectives 33 and percent yield 34. Note that isogram 32 represents the aforementioned Motorola six-sigma quality of performance criterion. Origin 37 illustrates a centered process with zero shift and very high deviation. Coordinate location 38 illustrates the locus of merged SPC data for a high-yield performance of the order of 100 defects per million (dpM) and 99.99-percent process yield.

Figure 3:
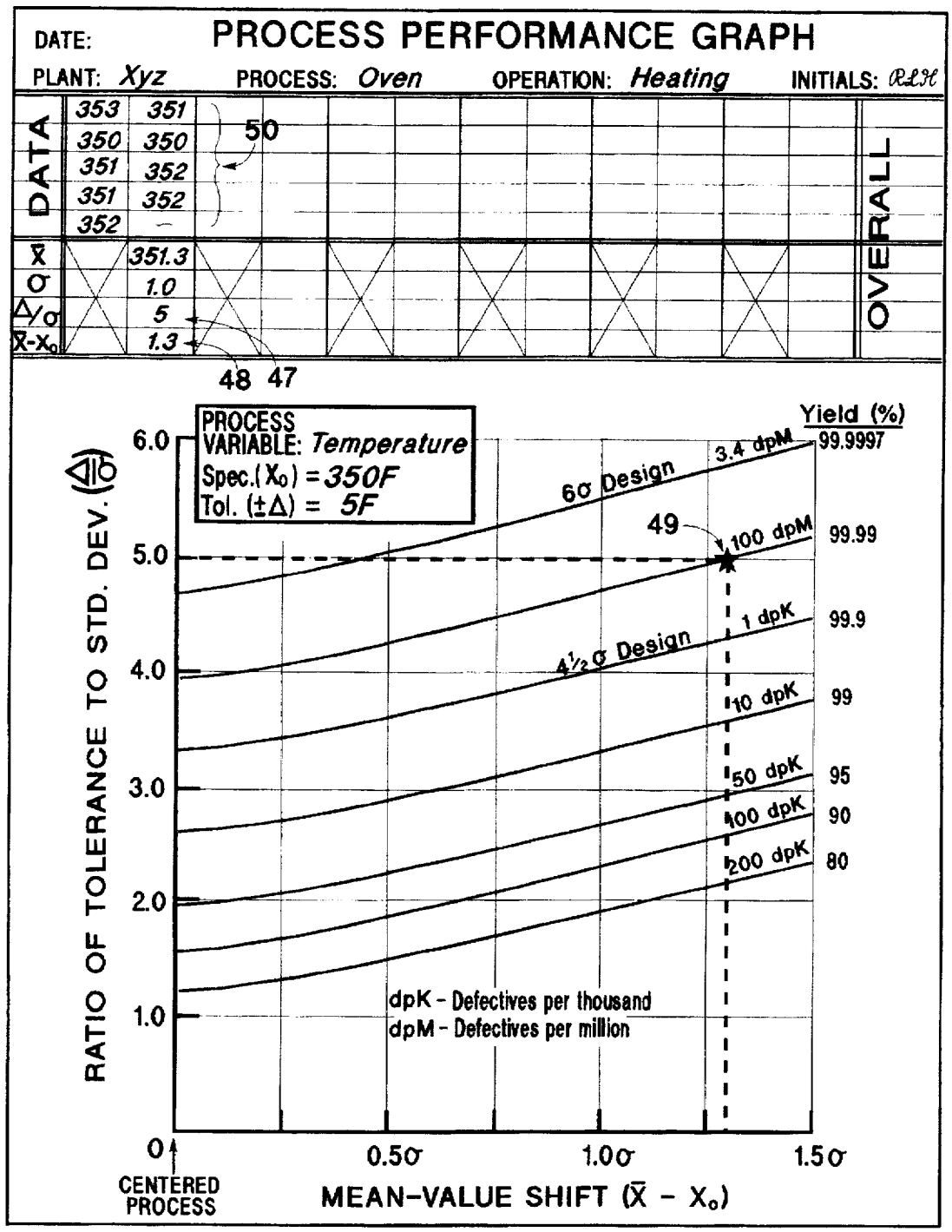
FIG. 3 is a process performance data sheet and isogrammetric graph showing an example using temperature data from an oven heating process.

Manual implementation of the method is facilitated by use of a data sheet and isogrammetric chart as shown in FIG. 3 and called Process Performance Graph, which provides convenient documentation means for process conditions, data, and calculations. Example data 50 are for temperature of a heating process, herein shown as a subprocess in the later FIG. 4. The chart plus a pencil and a pocket calculator with X-bar and sigma keys are all that are required to manually analyze the process data. The resulting statistical metrics of deviation ratio 47 and mean-value shift 48 are coordinates which define graph point 49 and quantify process performance in terms of the probable number of defectives occurring in the process. Extrapolation between isograms may be necessary for coordinates of intermediate points but it is straightforward to prepare charts with many more isogram family members by reference to mathematical tables such as are contained in the Handbook of Mathematical Functions published by the United States National Bureau of Standards (now National Institute of Standards and Technology) in June 1964.

Figure 4:
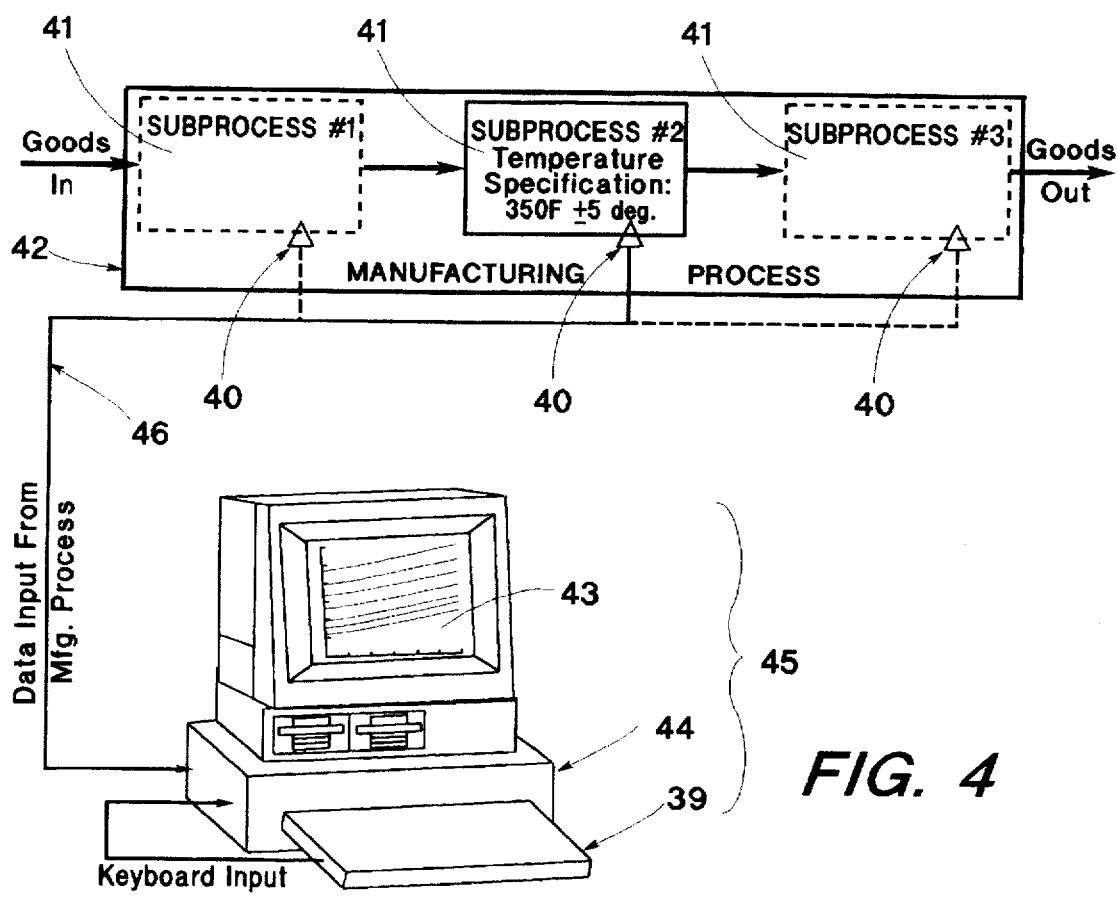
FIG. 4 is a simplified process diagram showing key components for on-line implementation of the present invention via computer means.
Figure 4A:
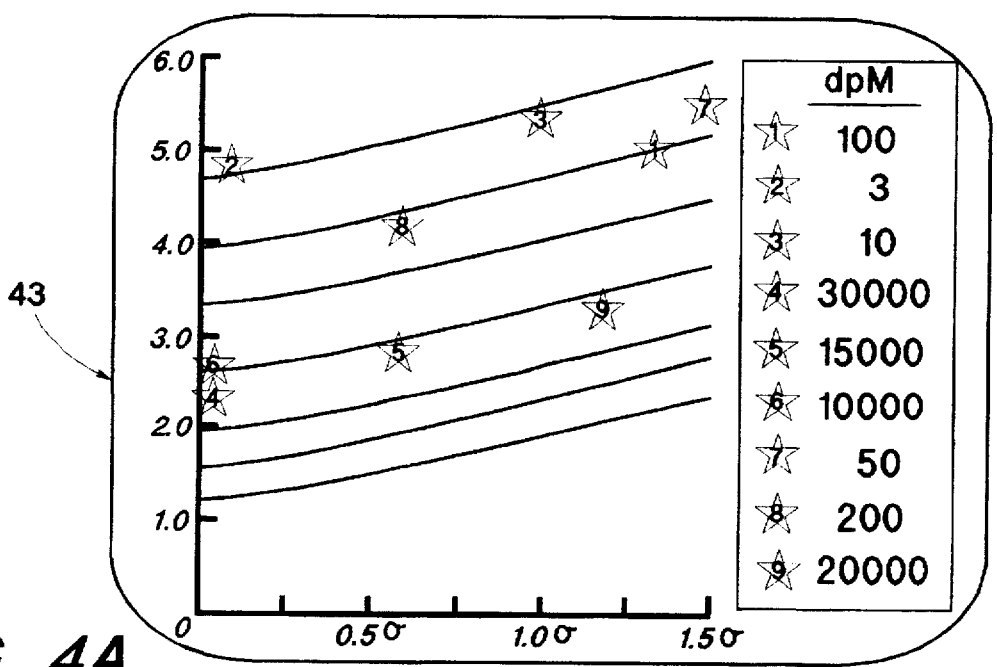
FIG. 4A is an enlarged view of a computer display showing graphical and numerical presentations of statistical defectives measurement results.
Figure 5:
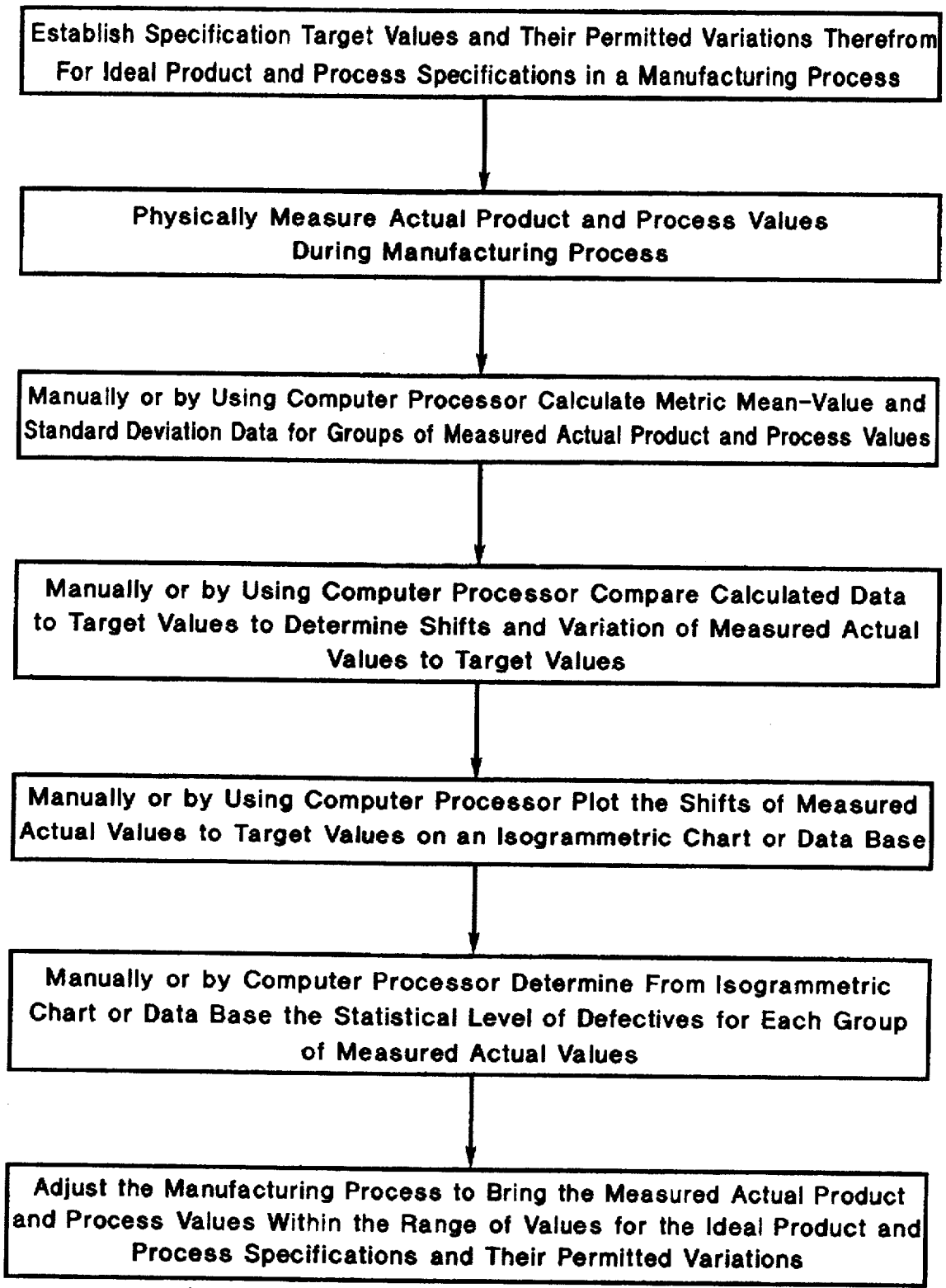
FIG. 5 is a flow diagram of the method steps herein.

Referring now to FIG. 4, there is shown a system for on-line implementation of the invented method on manufacturing process 42 using computer means 44 with direct connection 46 to process sensors 40 which provide for automatic data pick-up from subprocesses 41 and direct transmission and input to computer 44 which accomplishes the isogrammetric analysis. Operator access for initialization and printed reports is via keyboard 39. Computer 44, keyboard 39 and display 43 along with a generic printer (not shown) comprise a shop-floor workstation 45. Automatic process-sensor data and manual keyboard entry commands provide essential inputs to workstation 45 which has been augmented with the isogrammetric format and data base. The operator observes the presentation of the statistical defectives-measurement information in graphic or numeric form via display 43 (see also FIG. 4A) or by printer means, and then can act immediately to make the necessary process changes and adjustments or, alternatively, shut down the manufacturing process until engineering modifications can be made. These are the same actions that would be accomplished even with the totally manual implementation using a calculator and data-graph analysis form of FIG. 3, however, with on-line computer implementation of the isogrammetric method the level-of-defectives statistics are presented automatically and are continuously updated. Clearly, implementation using a workstation with automatic calculation and simultaneous display of quality of performance of multiple subprocess variables and in-progress product variables, each analyzed separately and simultaneously using the isogrammetric format, provides a more efficient use of the invented method than by manual calculation and charting of each individual process variable and product parameter.

It should be noted that many different monitoring and statistical analysis methods are in commercial use both off line and on line in manufacturing and other data-dependent venues such as testing laboratories, and all would be enhanced by adding the defectives measurement feature that is provided by the invented isogrammetric method.

What is claimed is:

1. A method for monitoring and analyzing data for a process comprising the steps of:
   (a) establishing specification target values,
   (b) (acquiring)measuring said process to acquire data of a variable measured during a measuring operation and calculating off-line the statistical process control metrics mean-value and standard deviation which represent a variation of said data,
   (c) comparing said calculated statistical metrics to specification target values and permitted variations to calculate mean-value shift and ratio of design tolerance to standard deviation,
   (d) plotting instantaneous or time-averaged values of mean-value shift and ratio of design tolerance to standard deviation on an isogrammetric representation consisting of a spatial array of lines of constant defect-level performance based on statistical isograms for constant quality-of-performance criteria, and
   (e) providing statistical level-of-defectives/defaults/failures performance measurement directly from isogrammetric representation coordinates of the plotted values.

2. A method for monitoring and adjusting a high-yield manufacturing process which produces a product, said method comprising the steps of:
   (a) establishing specification target values and permitted variations of ideal product and process variable readings and design specifications for desired high yield level-of-defectives performance,
   (b) measuring with sensors subgroups of process raw data of said product or process variable readings during a manufacturing process and then calculating the statistical process control metrics mean-value and standard deviation which represent a data variation from said specification target values,
   (c) comparing said calculated statistical process control metrics for said data subgroups of process raw data to said specification target values and permitted variations of ideal product and process variable readings to calculate the mean-value shift from said specification target values and permitted variations and to calculate the ratio of design tolerance to actual standard deviation for each product or process variable,
   (d) plotting the values of said mean-value shift and said ratio of design tolerance to actual standard deviation for each subgroup of process raw data on an isogrammetric representation consisting of a spatial array of data coordinates defining lines of constant defect-level performance based on statistical isograms for constant quality-of-performance criteria,
   (e) calculating for a plurality of subgroups of process raw data, either individually or averaged together, the statistical level-of-defective product or process performance values directly from said representation,
   (f) displaying statistical level-of-defectives performance calculated values for at least one subgroup of said subgroups of process raw data on a medium showing performance isograms including the isogram representing the specification target value for level-of-defectives performance, and (g) performing necessary process adjustments or shutting down the manufacturing process in response to said level-of-defectives performance calculated values as necessary to reduce product or process defectives and increase process product yield, wherein said step of performing process adjustments or shutting down the manufacturing process is performed by a process operator.

3. The method for monitoring and adjusting a high-yield process as set forth in claim 2 further comprising a step of relating said level-of-defectives performance to yield of the high-yield process wherein 3 defects per million equals 99.9997 percent yield and level of defects ranges to 200 defects per thousand which equals 80 percent yield.

4. The method for monitoring and adjusting a high-yield process as set forth in claim 2 wherein said step of plotting values on an isogrammetric representation is performed manually and further wherein said isogrammetric representation is a graphical chart.

5. The method for monitoring and adjusting a high-yield process as set forth in claim 2 wherein said step of plotting values on an isogrammetric representation is performed manually and further wherein said isogrammetric representation is a numerical chart.

6. The method for monitoring and adjusting a high-yield process as set forth in claim 3 wherein said step of plotting values on an isogrammetric representation is performed using a computer and further wherein said isogrammetric representation is a data base.

7. The method for monitoring and adjusting a high-yield process as set forth in claim 6 wherein said step of measuring raw process data is performed automatically by sensors connected to a processor.

8. The method for monitoring and adjusting a high-yield process as set forth in claim 7 wherein said step of displaying on a medium is performed using a graphical display or printout.

9. The method for monitoring and adjusting a high-yield process as set forth in claim 7 wherein said step of displaying on a medium is performed using a numerical display or printout.

10. The method for monitoring and adjusting a high-yield process as set forth in claim 7 wherein said step of calculating the statistical level-of-defective product or process values is performed automatically using a processor.

* * * * *